United States Patent [19]

Kozel et al.

[11] 3,708,610

[45] Jan. 2, 1973

[54] NON-DELAMINATING BUS ASSEMBLY FOR ELECTRONIC SYSTEMS AND METHOD OF FORMING SAME

[75] Inventors: Charles A. Kozel, McHenry; Nathan A. Baraglia, Stone Park; George C. Wright, Barrington, all of Ill.

[73] Assignee: Methode Manufacturing Corp., Rolling Meadows, Ill.

[22] Filed: Sept. 8, 1971

[21] Appl. No.: 178,562

[52] U.S. Cl. ..............174/72 B, 29/624, 174/117 FF, 174/DIG. 8

[51] Int. Cl. ........H01b 7/08, H01b 13/00, H02g 5/00

[58] Field of Search ..........174/72 B, 117 FF, DIG. 8; 29/624, 626, 627

[56] References Cited

UNITED STATES PATENTS

| | | | |
|---|---|---|---|
| 3,264,403 | 8/1966 | Erdle | 174/72 B |
| 3,396,230 | 8/1968 | Crimmins | 174/72 B |
| 3,495,139 | 2/1970 | Brown et al. | 174/DIG. 8 UX |
| 3,520,987 | 7/1970 | Ohlrich | 174/72 B |

*Primary Examiner*—Laramie E. Askin

*Attorney*—John A. Dienner et al.

[57] ABSTRACT

A multilayer, multiconductor or single conductor insulated bus assembly with jacket envelope that will not delaminate or lose capacitance when subjected to high temperatures such as encountered in wave soldering on printed circuit boards or conventional temperature/time soldering cycles. The jacket envelope is formed from an irradiated expanded tube that fits over the conductor bus subassembly and upon application of heat shrinks to a predetermined lesser diameter forming an outer layer about the body of the bus bar subassembly with all connecting terminals extending through openings punched in the jacket.

5 Claims, 6 Drawing Figures

Inventors:-
Charles A. Kozel,
Nathan A. Baraglia,
George C. Wright,
By Johnson, Dienner, Emrich, Verbeck & Wagner Attys.

NON-DELAMINATING BUS ASSEMBLY FOR ELECTRONIC SYSTEMS AND METHOD OF FORMING SAME

BACKGROUND OF INVENTION

With the need for high current distribution and maximum capacitance values to drive a multiplicity of active components on a printed circuit board or wiring panel, various new concepts have evolved to supply greater current capacity than economically feasible on copper clad etched printed circuit boards. One of the concepts is a single or multiconductor, multilayer bus bar having a multiplicity of tabs that plug into selected positions on the printed circuit board or positioned on the pins of a wiring panel and subsequently soldered to the boards or panels. Such single or multiconductor, multilayer bus assemblies consist of a conductor or conductors stacked vertically and insulated between and outside each conductor plane with individual insulating strips of dielectric material. The dielectric material normally used on high capacitance bus systems is in the thin-film family of polyester or polyvinyl fluoride ranging from 0.0005 to 0.010 mils.

Such prior single or multiconductor, multilayer bus assemblies, the conductor or conductors, the interleaved insulating strips and the outer insulating strips are manually or mechanically layed together one unit at a time and bonded together using an adhesive agent under heat and pressure. The adhesives used to bond dielectric film to conductors have "B" staged, non-toxic, non-corrosive characteristics of the thermoplastic family with a plasticizing temperature in the 300° to 320°F range.

To achieve an encapsulation of such bus assembly and to leave only the connecting tabs or terminals uninsulated, the insulating layers are fabricated wider than the conductor material and all overlapping insulation is sealed together or an encapsulating compound is manually or mechanically applied to seal the edges. The resulting capacitance of the prior structure is a function of the thickness of the dielectric material between conductors and the integrity of the adhesive bond of the internal and external insulating strips to the conductor strips through all process applications.

SUMMARY OF THE INVENTION

To overcome the limitations and disadvantages of such prior structures, we have conceived of a new discrete single or multiconductor, multilayer insulated bus assembly that will not deliminate or lose the free state designed capacitance during process installation of wave soldering or conventional time/temperature soldering processes.

The new structure comprises a single or multiplicity of conductors having only the conductors and inner insulation strips interleaved and bonded together. The outer insulation consists of an irradiated expanded tube or sleeve having an "elastic memory" formed by using one of the well-known modified base polymers such as polyolefin, polyvinylchloride, polyvinylidene fluoride, neoprene elastomer, and silicone elastomer. A characteristic of irradiated expanded tubing is the ability to activate the elastic memory by application of heat to cause the tubing to recover to a predetermined lesser diameter.

Our new structure comprises a single or multiconductor, multilayer assembly inserted into the irradiated expanded tube having a recovered inside cross section opening less than the cross sectional areas of the prelaminated bus subassembly. The prelaminated bus subassembly is inserted into the tube and upon application of heat generated by wave soldering or the like, the irradiated, modified base polymer jacket shrinks to conform to the body of the bus assembly with all connecting terminals extending through openings punched in the jacket. Because the cross sectional area of the body of the prelaminated bus subassembly is greater than the fully recovered cross section opening in the tubing, the tubing applies a containing pressure on the laminated subassembly.

Another characteristic and advantage of using an irradiated modified base polymer material with elastic memory is that the material can be temperature cycled over and over to achieve full recovery of the elastic memory.

DESCRIPTION OF DRAWINGS

For a better understanding of this invention reference may be made to the accompanying drawing, in which.

DESCRIPTION OF PREFERRED EMBODIMENT

Figures 1, 2, 3, 4, 5, 6:
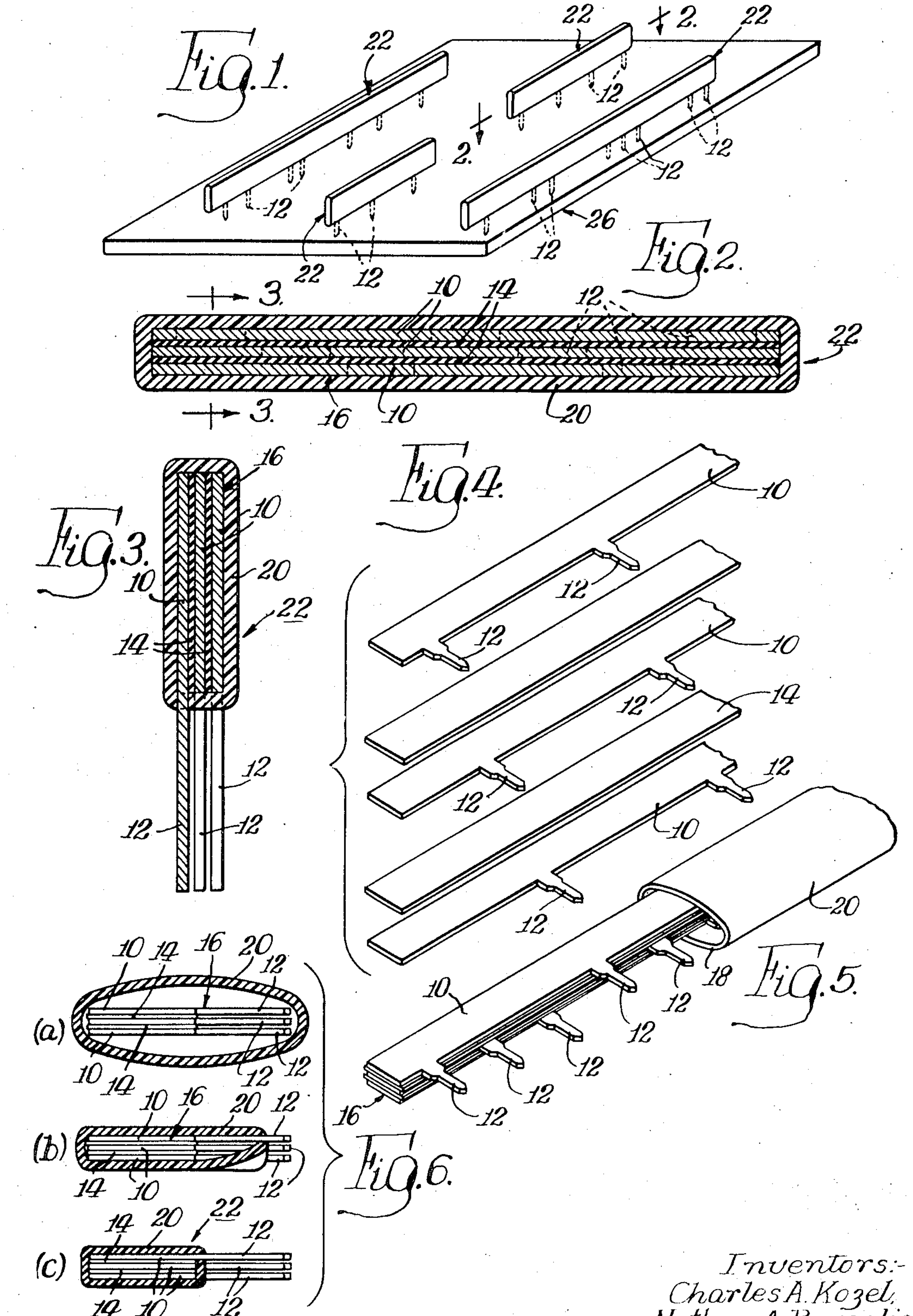
FIG. 1 is a perspective view of a plurality of bus bar assemblies embodying the principles of this invention mounted on a printed circuit board.
FIG. 2 is a cross-sectional view of one of the bus assemblies of FIG. 1, taken along the line 2—2 and looking in the direction of the arrows.
FIG. 3 is a cross sectional view taken along the line 3—3 of FIG. 2 and looking in the direction of the arrows.
FIG. 4 is an exploded partial view of the conductor strips and insulator strips that are bonded together in assembling this invention to form a bus bar subassembly.
FIG. 5 is a perspective view showing the bus bar subassembly of FIG. 4 being inserted into an irradiated expanded tube.
FIG. 6 depicts three successive stages of making the preferred embodiment of this invention.

Referring to FIG. 4 there is shown a plurality of conductor strips 10 having electrical terminals or tabs 12 and disposed between adjacent conductor strips 10 are insulating strips 14, each having a slightly greater width than the conductors 10.

In constructing the invention the conductor strips 10 and interleaved insulating strips 14 are bonded together with one of the well-known adhesive agents having "B" staged, non-toxic, non-corrosive characteristics to form a prelaminated bus subassembly 16. Next the bus subassembly 16 is inserted [FIGS. 5 and 6(a)] into one of the end openings 18 of an irradiated expanded tube 20 having an "elastic memory" formed from a modified base polymer material, such as polyolefin, polyvinyl chloride, polyvinylidene fluoride, neoprene elastomer or silicone elastomer. The required characteristic of the irradiated expanded tubing 20 is the ability to activate the elastic memory by application of heat so that the tubing recovers to a predetermined lesser diameter.

The tabs or terminals 12 of conductor strips 10 are then punched through the side surface of tubing to project outwardly thereof, as shown in FIG. 6(b). The tabs 12 are formed with pointed ends for ease of penetrating the tubing. The unit is then subjected to a preconditioning temperature of 300° to 325°320° F to pre-shrink the irradiated expanded tubing to a snug fit around the embodiment. The entire unit is then placed in a soldering position with a printed circuit board of wiring panel (in FIG. 1 a printed circuit board 26 is depicted) and the tabs are soldered in place by wave soldering or conventional soldering techniques. The soldering process is conducted at temperatures over 400°F for 10 to 60 seconds dwell time. Finally the ends of tubing 20 are folded over and sealed in place.

During the soldering process the conductors can act as heat sinks and the heat radiates from the conductors to tubing 20 to reactivate the recovery cycle of the irradiated expanded tubing. The higher temperature of the soldering process continues to shrink the tubing 20 about the body of the prelaminated subassembly 16 as depicted in FIGS. 6(b) and 6(c) until its cross sectional area is less than the cross sectional area of the body of the prelaminated bus subassembly to provide a containing pressure on the subassembly. Concurrently, the heat transfer to the conductor strips during the soldering process (at temperatures in the order of 400° to 500°F) also replasticizes the thermoplastic adhesive to bond the dielectric material to the conductor strips.

FIGS. 2 and 3 depict the non-delaminated bus bar assembly 22 embodying the principles of this invention. The irradiated modified base polymer jacket 20 has shrunk in a manner to conform to the body of the bus bar subassembly 16 with terminals or tabs 12 extending out through perforations in the jacket. By selecting the size and characteristics of jacket 20 to have a recovered inside cross sectional opening less than the cross sectional area of the prelaminated bus subassembly the conductor and insulator strips are compressed together. This compression prevents the subassembly from loosening or delaminating during the soldering thermocycle and the added compression increases the product free state capacitance from 0 to 25 percent. After the wave soldering is complete, the bus assembly 22 cools and the adhesives set to a cured state under elastic compression.

It will be seen from the foregoing description that we have provided a novel bus bar assembly that will not delaminate or lose capacitance when subjected to wave soldering or conventional temperature-time soldering cycles.

We claim:

1. A bus bar assembly that will not delaminate or lose capacitance when subjected to high temperatures comprising a bus bar subassembly and an elastic jacket, said bus bar subassembly includes a plurality of spaced electrical conductors and interleaved insulating layers, each of said conductors having at least one terminal extending beyond the margins of said insulating layers, where said elastic jacket encloses said subassembly with said terminals extending outwardly through openings formed in said jacket and holds said subassembly under elastic compression.

2. A bus bar assembly as defined in claim 1, wherein said elastic jacket is made of an irradiated expanded modified base polymer tubing and has a recovered cross sectional area smaller than the uncompressed cross sectional area of the body of said subassembly.

3. A bus bar assembly as defined in claim 1, wherein said terminals project outwardly of said jacket in the same direction and along the length thereof to adapt the bus bar assembly to be mounted on a printed circuit board or the like.

4. A method of forming a bus bar assembly comprising the steps of bonding together a plurality of electrical conductors with interleaved insulating strips with at least one terminal extending from each of said conductors beyond the margin of said insulating strips to form a bus bar subassembly, inserting said subassembly into the open end of an irradiated modified base polymer jacket, and applying heat to said subassembly and jacket to cause said jacket to shrink and conform about the body of said bus bar subassembly with said terminals extending out through perforations in said jacket.

5. The method of claim 4, wherein said heat applying step comprises punching said terminals through said jacket a sufficient distance to expose their tips, positioning said subassembly in a soldering position in relation to a printed circuit board or the like, and soldering said terminals, whereby the heat generated by said soldering activates the recovery cycle of said irradiated tubing to cause said jacket to shrink about the body of said subassembly.

* * * * *